United States Patent [19]
Dommerich, III

[11] Patent Number: 5,359,291
[45] Date of Patent: Oct. 25, 1994

[54] METHOD AND APPARATUS FOR DETECTING SHORT CIRCUITS

[75] Inventor: Alexander L. Dommerich, III, Frederick, Md.

[73] Assignee: AlliedSignal Inc., Morris Township, Morris County, N.J.

[21] Appl. No.: 41,665

[22] Filed: Apr. 1, 1993

[51] Int. Cl.⁵ .............................................. G01R 31/08
[52] U.S. Cl. ..................... 324/523; 324/522; 324/527; 324/528; 324/537
[58] Field of Search ............... 324/500, 511, 512, 522, 324/523, 527, 528, 537

[56] References Cited

U.S. PATENT DOCUMENTS

| | | | |
|---|---|---|---|
| 2,823,350 | 2/1958 | Macleish | 324/523 |
| 3,991,363 | 11/1976 | Lathrop | 324/528 X |
| 4,656,416 | 4/1987 | Brasfield | 324/527 |
| 5,034,599 | 7/1991 | Hirata | 235/438 |
| 5,087,874 | 2/1992 | Robinson | 324/73.1 |

Primary Examiner—Kenneth A. Wieder
Assistant Examiner—Glenn W. Brown
Attorney, Agent, or Firm—Verne E. Kreger, Jr.

[57] ABSTRACT

A simple method and apparatus for detecting short circuits between a first circuit (77) and a second circuit (76) of a printed wiring board or printed wiring assembly by using a voltage source (10) and a sensitive lo-gamp voltmeter (11). The voltage source (10) impresses a voltage potential between the first (77) and second circuit (76). The single voltmeter probe (39) passes along the circuit having the positive potential. The signal from the probe (39) is filtered and passed through a variable gain amplification circuit. The result is displayed on a sensitive ammeter (65). The short circuit is detected at the point on the circuit where the meter displays the minimum voltage with respect to the impressed potential.

10 Claims, 3 Drawing Sheets

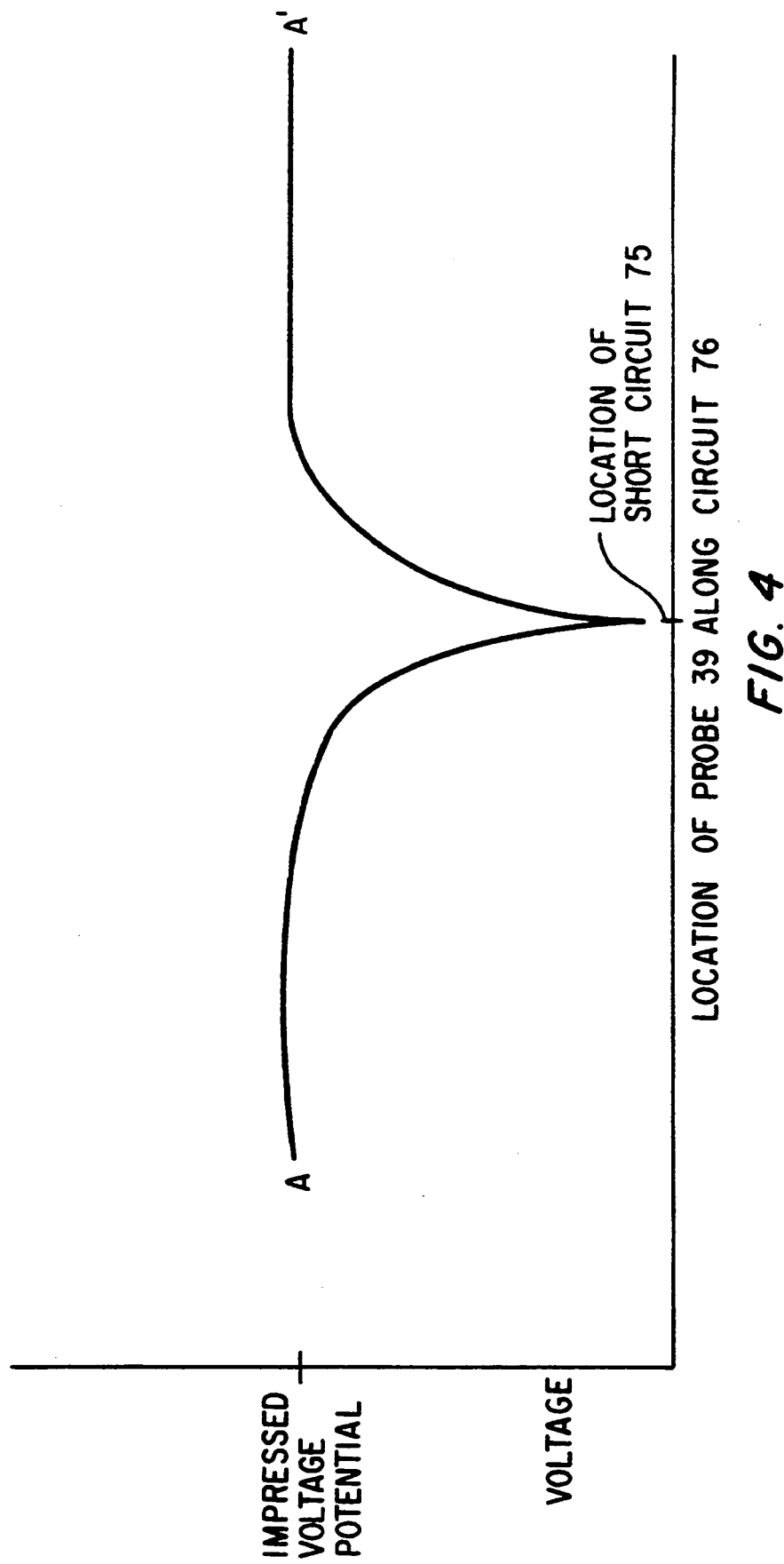

METHOD AND APPARATUS FOR DETECTING SHORT CIRCUITS

TECHNICAL FIELD OF THE INVENTION

The present invention relates to a method and apparatus for detecting short circuits and, more particularly, for detecting short circuits on printed wiring boards and printed wiring assemblies.

BACKGROUND OF THE INVENTION

Short circuits are a common and annoying problem on electronic circuit boards. Short circuits may be caused as a result of the manufacturing process of the printed wiring boards, during the process of soldering electronic components to the printed wiring boards or because of a failure within an electronic component on a printed wiring assembly.

Newly manufactured printed wiring boards often contain short circuits between traces which prevent the circuits on the circuit boards from operating properly. A trace is generally a tinned copper conductor which interconnects multiple electronic components on the circuit board to form circuits. A trace, in conjunction with other traces, forms the "artwork" on the printed wiring boards. Short circuits between traces may be the result of residual conducting material left on the circuit boards after its manufacture that inadvertently bridges two or more traces. The residual material may be so fine as to be invisible to the human eye.

Short circuits may also form during the procedure of soldering electronic components, such as chips, transistors, diodes, resistors and capacitors onto the electronic circuit board. The short circuit may be the result of solder splashes that bridge two or more traces or the result of foreign conducting material that inadvertently attaches to the circuit board.

Locating short circuits on printed wiring assemblies can be very difficult due to the circuit complexity. Short circuits may occur within the electronic components themselves. Although manufacturers of electronic components maintain high quality standards, some components may be defective with internal short circuits when they are shipped from the manufacturer's facility. Additionally, an electronic component may develop an internal short circuit after limited or prolonged use. Accordingly, it can be easy to determine that a short exists, but very difficult to locate it on a populated circuit board.

U.S. Pat. No. 5,087,874 discloses an apparatus for locating a short circuit between a first and second network with a pair of probes, a measurement device and a current source. Continually locating the probes and measuring the voltage drop between the probes provides the means for locating the short circuit. However, this process of continually comparing voltage readings may be time consuming. Furthermore, locating short circuits between circuits on electronic circuit boards populated with electronic components is extremely difficult using dual measurement probes.

U.S. Pat. No. 4,656,416 discloses a shorts locator under the control of a central processing unit. A first process identifies the second circuit to which the shorted circuit is connected. The second process locates the site of the short. A low-level AC current is injected between two shorted traces. Points along the traces are contacted by a high impedance probe. The signal is processed and the result is displayed. A known problem associated with this technique is that the injected AC source is adversely affected by the circuit reactance. For example, injecting alternating currents produces misleading indications because of the bypassing effect of various decoupling components.

It is also known to troubleshoot a large circuit board by placing it upon a grid of pointed pins, also referred to as a "bed of nails." Automatic test equipment can select various pins and inject a stimulating current or voltage. Another pin can be selected to measure the current or voltage. This technique has its drawbacks because troubleshooting a circuit board depends on nail placement.

The difficulty of locating a short circuit is compounded on circuit boards given the large number of electronic components installed on them. It is preferable to be able to troubleshoot an electronic circuit board without having to remove electronic chips and hundreds of other components from the circuit board to detect a short circuit.

Additionally, many times a technician must troubleshoot an electronic circuit board in the field with limited diagnostic resources. Some of the diagnostic equipment disclosed in the prior art is impracticable for a technician to troubleshoot circuit boards in the field.

SUMMARY OF THE INVENTION

In accordance with the illustrative embodiments demonstrating features and advantages of the present invention, there is provided an apparatus and method for detecting short circuits that overcome the deficiencies of the prior art. The apparatus of the present invention consists of a 250 millivolt(mv) DC voltage source and a sensitive log amp DC voltmeter. The voltmeter consists of a first stage voltage follower with an integrator (low-pass filter) to reduce noise sensitivity, a second stage variable-gain amplifier and a third stage meter-protection circuit.

The method for detecting a short circuit between a first and second circuit consists of impressing a potential between the first and second circuit; adjusting the gain of the voltmeter; passing a single probe along the circuit having the positive polarity; measuring the voltage drop between the first and second circuit; and detecting the short circuit at the location on the circuit where the measured voltage reaches its minimum with respect to the impressed voltage.

The apparatus and method of this invention provides for an impressed voltage on either side of the short circuit. This allows current to flow into the unknown location of the short circuit from two directions instead of only one direction. As the single probe approaches the location of the short circuit, the measured voltage approaches the null voltage. The null voltage is that voltage level that represents the lowest voltage level that the probe detects as the technician searches for the short circuit. Conversely, as the probe is moved away from the location of the short circuit, the measured voltage approaches the impressed voltage value. As the probe approaches the short circuit from either direction along the circuit, the voltage level decreases, or deepens, until it reaches the null. The location of the null as detected by the probe is the exact location of the short circuit. In this manner, the precise location of the short circuit may be determined by viewing the voltage level registered on the meter. Therefore, by employing the simple apparatus and method, an improved and simplified technique is achieved for locating short circuits that are less than 2 ohms between circuits or within electronic components.

A short circuit between a first and second circuit is meant to include, but not be limited to, any short circuit between two traces that are both a part of the same circuit, any short circuit between two traces wherein each trace is a part of separate circuits, whereby, the first and second circuit may be located on common or different planes.

It is therefore an object of the present invention to provide a simple apparatus and method that is capable of detecting short circuits having a resistance below 2 ohms on circuit boards.

It is a further object of the present invention to provide a simple method and apparatus to detect short circuits within electronic components.

It is an advantage of the present invention that it can be easily transported to any location to troubleshoot electronic circuit boards for short circuits.

It is a further advantage of the present invention in that the electronic components on electronic circuit boards do not have to be removed in order to troubleshoot for short circuits.

It is still a further advantage of the present invention in that the operation is far less affected by circuit reactance.

It is still a further advantage of the present invention that there exists an automatic gain control that responds to changing circuit and short circuit resistances.

BRIEF DESCRIPTION OF THE DRAWINGS

FIG. 4 is a graphical depiction of the voltage reading on the voltmeter as the probe travels between points A and A' of FIG. 3.

DETAILED DESCRIPTION OF THE INVENTION

Figure 1:
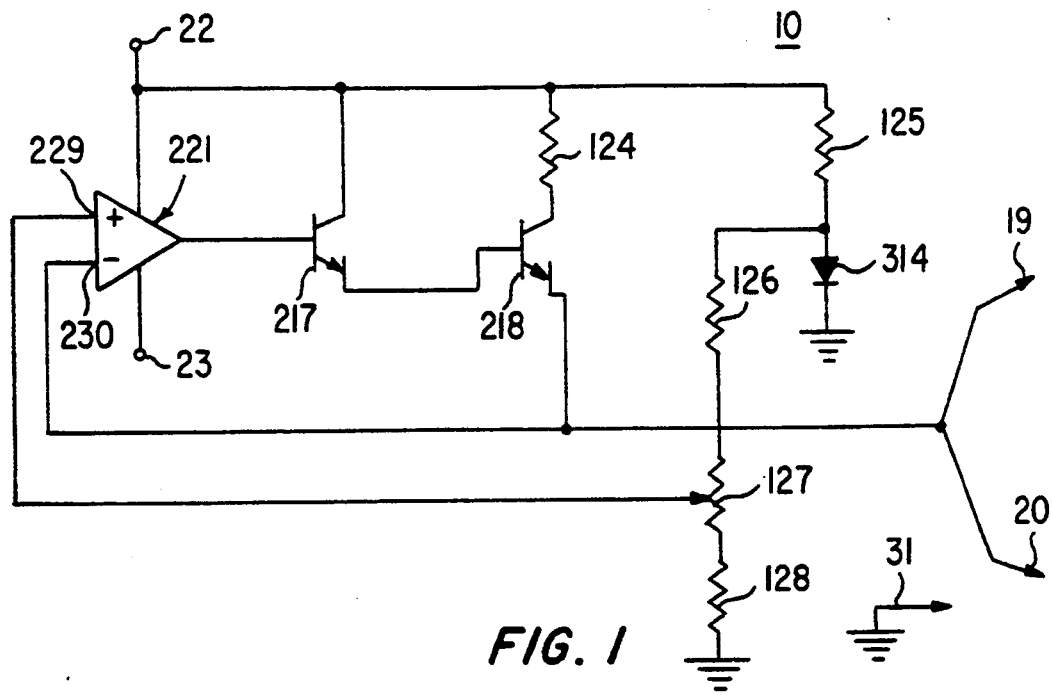
FIG. 1 is an electrical schematic for the 250 mv DC source.

The preferred embodiment of the apparatus of the invention implementing the preferred method of detecting short circuits is described below.

The apparatus of the present invention consists of a 250 millivolt DC voltage source 10 and a sensitive log amp DC voltmeter 11. Voltmeter 11 consists of a first stage integrator 36 (low-pass filter) to reduce noise sensitivity, a second stage 37 variable-gain amplifier and a third stage 38 meter-protection circuit.

Figure 2:
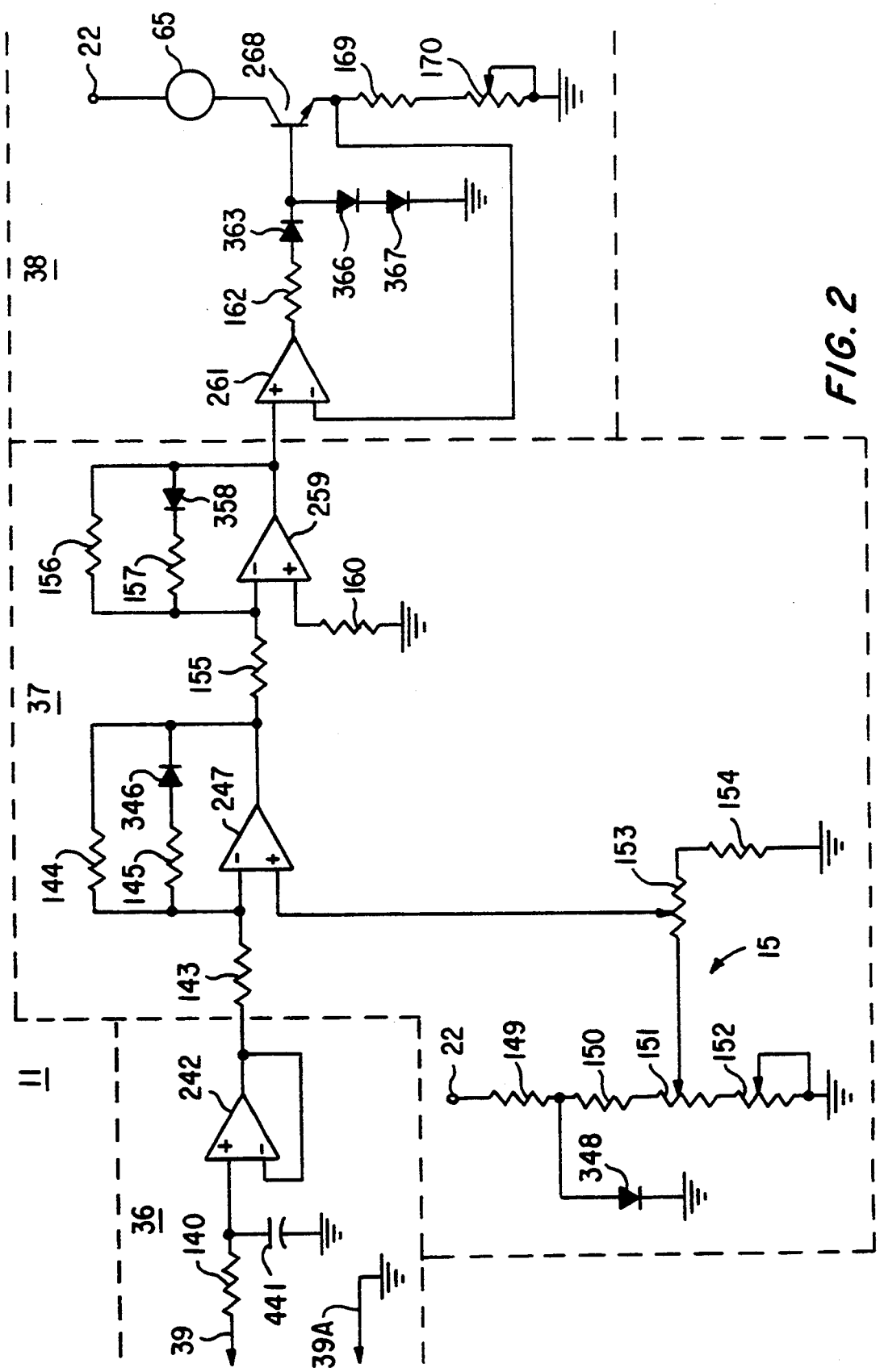
FIG. 2 is an electrical schematic for the sensitive logamp DC voltmeter.

The circuit embodiments of the voltage source 10 and voltmeter 11 are illustrated in detail in FIGS. 1 and 2, respectively. The recommended component values and circuit parameters for these circuits may be found in Table 1 below.

Referring to FIG. 1, a schematic diagram is shown for the voltage source 10 which is capable of supplying about 1.5 amps D.C. at 250 mv D.C. This voltage level is preferred to ensure that the invention does not energize any active electronic devices to the "ON" state while they are tested for short circuits.

The voltage source 10 is generated from the output of amplifier 221 and transistors 217 and 218. Transistors 217 and 218 provide the necessary amplification to provide a stable 250 mv output that is capable of supplying a maximum 1.5 amp output which is limited by resistor 124.

The differential voltage input to amplifier 221 is provided by a voltage follower circuit and the output of transistor 218. The positive reference input voltage 229 to amplifier 221 consists of a voltage follower circuit comprising resistors 125, 126, 127 and 128 and diode 314. Resistor 127 is an adjustable resistor that adjusts to obtain the required 250 mv reference. Inverting reference input voltage 230 connects to the output of transistor 218.

Figure 3:
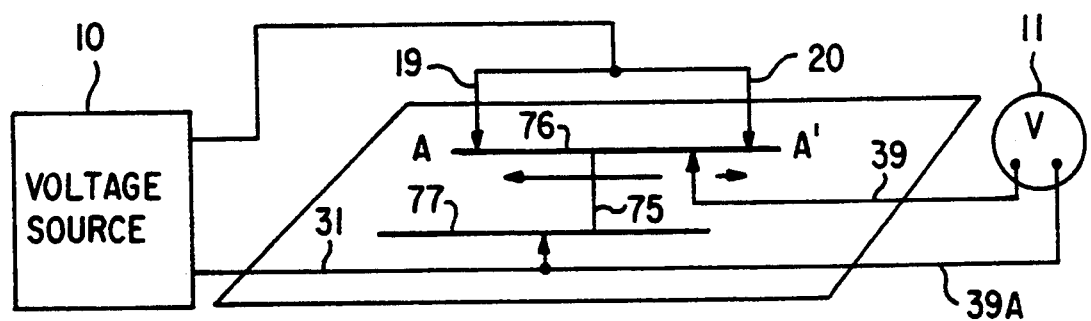
FIG. 3 is schematic diagram showing apparatus and method for finding short circuits between circuits in accordance with the present invention.

The output 19 and 20 of voltage source 10 is impressed across a circuit between points A and A' that contains the short circuit 75 as shown in FIG. 3. Therefore, a voltage potential exists on either side of short circuit 75 and allows a technician to measure voltages at any point along A and A' to detect short circuit 75.

FIG. 2 illustrates the circuit for the sensitive log amp voltmeter 11. Voltmeter 11 uses log amplifiers to provide for a wide range of gain compression as needed while measuring voltage potentials in search of short circuit 75. Voltmeter 11 consists of a first stage 36 voltage follower with a low-pass filter, a second stage 37 variable-gain amplifier and a third stage 38 meter-protection circuit.

The voltmeter probe 39 introduces a DC voltage signal to first stage 36 which passes the signal through a low-pass filter to reduce noise sensitivity. First stage 36 comprises resistor 140, capacitor 441 and amplifier 242. The output of amplifier 242 is connected to its inverting input and to the inverting input of amplifier 247 of second stage amplifier 37.

The second stage 37 is an amplification circuit that may be designed to provide any range of voltage gain. Preferably, second state 37 provides a voltage gain of about 7.5 to 3000. The amplification circuit comprises an adjustable voltage source 15 for offset voltage adjustment, a first amplification circuit comprising amplifier 247, resistors 143, 144, 145, diode 346 and a second amplification circuit comprising amplifier 259, resistors 155, 156, 157, 160 and diode 358.

The output of adjustable voltage source 15 connects to the positive input of amplifier 247. Adjustable voltage source 15 consists of resistors 149, 150, 151, 152, 153 and 154 and diode 348. The function of adjustable voltage source 15 input with relation to amplifier 247 is discussed below.

Log amplifier 247 provides a gain of between 7.5 and 30. When there is no differential input to amplifier 247, the output voltage of amplifier 247 remains near 0 v, and diode 346 does not conduct, eliminating resistor 145 from the feedback circuit. The gain of amplifier 247 is effectively 30 (30K÷1K ($R_{feedback} \div R_{input}$)). As the differential input to amplifier 247 increases, and the output voltage of amplifier 247 increases, diode 346 begins to conduct and shunts resistor 144, causing a gain decrease. The gain decrease continues until diode 346 turns on hard causing resistor 145 to be in parallel with resistor 144 resulting in a gain of about 7.5 (7.5K÷1K).

Log amplifier 259 provides a gain of between 1.0 and 100. When there is no differential input to amplifier 259, the output voltage remains near 0 v. Diode 358 does not conduct and eliminates resistor 157 from the feedback circuit, so that the gain of amplifier 259 is effectively 100 (100K÷1K ($R_{feedback} \div R_{input}$)). As the differential input to amplifier 259 increases, diode 358 begins to conduct and shunts resistor 156, causing a gain decrease. The gain decrease continues until diode 358 turns on hard causing resistor 157 to be in parallel with resistor 156 resulting in a gain of about 1.0 (1K÷1K). The gain of amplifier 259 is dependent upon the output of amplifier of 247, since the positive input of amplifier 259 is constant. The total gain of log amplifiers 247 and 259 combined is a minimum of about 7.5 (1×7.5) to a maximum of about 3,000 (30×100).

The gain compression of second stage 37 from 7.5 to 3000 enables voltmeter 11 to track a wide range of voltage levels to detect a short circuit. Adjustable voltage source 15 provides an offset input signal to amplifier 247 to establish the baseline input voltage measured on probe 39 from which the gain will be calibrated. It also provides a means to adjust the offset so that maximum meter sensitivity or resolution can be maintained while probing for the short circuit. A lower voltmeter gain results when the differential input voltage at amplifier 247 becomes higher, and a higher voltmeter gain results when the differential input voltage approaches 0 v.

Initially, when a technician begins to probe a circuit for a short circuit, a voltage signal, approximately equal to the impressed voltage from voltage source 10, will be detected by probe 39. The gain of second stage 37 is set at low gain to detect gross voltage variations along the circuit network. At this point of detection, the meter's low resolution is sufficient to detect wide variations of voltage differentials. As probe 39 approaches the short circuit, the difference between the measured voltage on probe 39 and the adjustable voltage source 15 at the input of amplifier 247 will decrease and cause the gain of amplifier 247 to increase and increase resolution of meter 65. The gain is increased by adjusting resistors 151, 152 and 153 to reduce the input voltage differential at amplifier 247 and increase the gain. Resistors 152 and 153 provide fine gain adjustment, and resistor 151 provides coarse gain adjustment. As the technician increases the gain, the resolution of meter 65 increases. This allows meter 65 to register minute voltage drops between different sections of a circuit in order to pinpoint the exact location of the short circuit. More sensitivity may be adjusted for and the precise short circuit or null location can be determined.

The third stage 38 is the meter-protection circuit. It allows for the use of a sensitive 0-50 microampere (μa) meter 65 to indicate the value of the voltage potential detected by probe 39. In the preferred embodiment, an analog meter is used with a current limit protection circuit because it provides a more operator friendly indication of the measured voltage. The meter protection circuit 38 prevents the needle of meter 65 from pinning hard against the meter stop as a result of a high voltage signal on probe 39. Meter 65 is driven by a current source, which magnitude is determined from the voltage drop across resistors 169 and 170. The voltage drop across resistors 169 and 170 is limited by the maximum voltage drop across the series diodes 366 and 367 which shunt the base of transistor 268 to ground. Resistor 170 is variable and is adjusted to allow a maximum of 60 μa through meter 65. The meter protection circuit allows for meter 65 to be in its normal dynamic range until the shunting diodes 366 and 367 reach their threshold voltage and prevent excessive current from passing through meter 65.

FIG. 3 represents the schematic hookup of the voltage source 10 and voltmeter 11 to detect a short circuit 75 between circuit 76 and circuit 77. Connection point 31 of the voltage source 10 and connection point 39a of the voltmeter 11 connect to a common point anywhere on circuit 77. The output 19 and 20 of voltage source 10 connect to separate points on circuit 76 that bridge short circuit 75 as designated by points A and A'. The connection causes the current from the voltage source to flow through two paths to short circuit 75. Probe 39 follows circuit 76 between outputs 19 and 20.

The resultant voltage potential between the first and second circuit is illustrated in FIG. 4. As probe 39 approaches the location of the short circuit, the measured voltage approaches the null voltage. Conversely, as probe 39 is moved away from the location of short circuit 75, the measured voltage approaches the impressed voltage value. As probe 39 approaches short circuit 75 from either direction along circuit 76, the voltage level decreases, or deepens, until it reaches the null. Because of the extreme sensitivity of voltmeter 11, a movement of probe 39 as little as a 1/16 inch along circuit 76 towards or away from short circuit 75 will result in a differential voltage reading on meter 65.

TABLE 1

| Preferred Element Values | | |
|---|---|---|
| 22 | +15 VDC | |
| 23 | −15 VDC | |
| All values in ohms (Ω) with tolerances ±5% except as noted: | | |
| 124 | 10 | 5W 10% |
| 125 | 1K | 1W 10% |
| 126 | 10K | ¼W 10% |
| 127 | 3.5K | |
| 128 | 4.7K | |
| 140 | 100K | |
| 143 | 1K | |
| 144 | 30K | |
| 145 | 10K | |
| 149 | 1K | |
| 150 | 10K | ¼W 10% |
| 151 | 10K | 10 turn |
| 152 | 100 | 10 turn |
| 153 | 100 | 10 turn |
| 154 | 100K | ¼W 10% |
| 155 | 1K | |
| 156 | 100K | ¼W 10% |
| 157 | 1K | |
| 160 | 1K | |
| 162 | 1K | |
| 169 | 13K | ¼W 10% |
| 170 | 5K | |
| 217 | 2N2222A NPN transistor | |
| 218 | 2N3055 NPN transistor | |
| 221 | 741 operational amplifier | |
| 242 | 741 operational amplifier | |
| 247 | 741 operational amplifier | |
| 259 | 741 operational amplifier | |
| 261 | 741 operational amplifier | |
| 268 | 2N2222A NPN transistor | |
| 314 | IN914 diode | |
| 346 | IN914 diode | |
| 348 | IN914 diode | |
| 358 | IN914 diode | |
| 363 | IN914 diode | |
| 366 | IN914 diode | |
| 367 | IN914 diode | |
| 441 | .1 μf capacitor | |

While this invention has been described in conjunction with a specific embodiment of a short circuit detector for circuit boards, it should be understood that this embodiment is merely illustrative. Numerous modifications and alterations may be made to the apparatus, in it use, and methods employed without departing from the spirit and scope of the invention. It is therefore intended that the patent shall cover whatever features and methods of patentable novelty that exist in the invention and which are encompassed within the following claims.

I claim:

1. A short circuit detection device for detecting the precise location of a short circuit between a first circuit and a second circuit comprising:
   a. a voltage source means for impressing a voltage potential between a first contact point on said first circuit and a second contact point and a third contact point on said second circuit, wherein said second and third contact points span said short circuit so said second circuit is at a different voltage potential with respect to said first circuit,
   whereby electrical current flows from said second contact point and third contact point of said second circuit to said first circuit through the path created by said short circuit;
   b. detecting means for contacting said second circuit in various location points between said second and third contact points in order to detect a measurable voltage potential between said first and second circuit;
   c. amplifying means for amplifying said measured voltage potential detected by said detecting means;
   d. adjusting means for adjusting the gain of said amplifying means; and
   e. display means for displaying a representation of said amplified measured voltage potential,
   whereby the location point along said second circuit which displays the minimum measured voltage potential with respect to said impressed voltage potential indicates the precise location of said short circuit between said first and second circuits.

2. The short circuit detection device of claim 1 wherein active electronic components are electrically connected between said first circuit and said second circuit.

3. The short circuit detection device of claim 2 wherein said impressed voltage potential is selected to be below a level which will turn ON said active electronic components.

4. The short circuit detection device of claim 3 wherein said impressed voltage potential is 250 mv D.C.

5. The short circuit detection device of claim 1 wherein said amplifying means is a log amplifying circuit.

6. The short circuit detection device of claim 1 wherein said display means is an analog meter.

7. The short circuit detection device of claim 1 wherein said amplifying means has a gain from about 7.5 to about 3000.

8. The short circuit detection device of claim 1 wherein said amplifying means is automatic.

9. The short circuit detection device of claim 1 wherein said first and second circuits are on an electronic circuit board.

10. A method for detecting said precise location of a short circuit between a first circuit and a second circuit comprising of the steps:
   a. impressing a voltage potential between said first circuit and said second circuit between a first contact point on said first circuit and a second contact point and a third contact point on said second circuit, wherein said second and third contact points span said short circuit and said second circuit has a different voltage potential with respect to said first circuit,
   whereby electrical current flows between said second and third contact points of said second circuit to said first circuit through the path created by said short circuit;
   b. contacting said second circuit in various location points between said second contact point and said third contact point in order to detect a measurable voltage potential between said first and second circuit;
   c. amplifying said measured voltage potential detected between said first and second circuits;
   d. adjusting said amplifying gain; and
   e. displaying a representation of said amplified measured voltage potential;
   whereby the location point along the second circuit which displays the minimum measured voltage potential with respect to said impressed voltage potential indicates the precise location of the short circuit between said first and second circuits.

* * * * *